Figure 1:
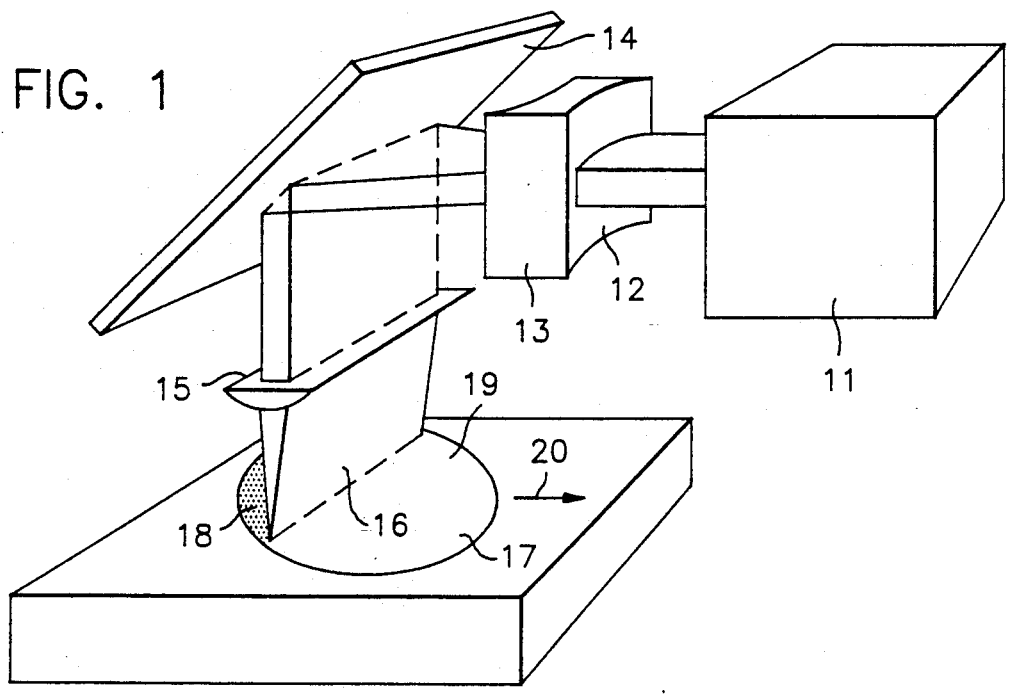

United States Patent [19]

Nachshon

[11] Patent Number: 5,114,834
[45] Date of Patent: May 19, 1992

[54] PHOTORESIST REMOVAL

[76] Inventor: Yehuda Nachshon, 6, Haalon Street, Timrat, Israel

[21] Appl. No.: 407,141

[22] Filed: Sep. 14, 1989

Related U.S. Application Data

[63] Continuation-in-part of Ser. No. 260,526, Oct. 21, 1988, abandoned.

[30] Foreign Application Priority Data

Oct. 23, 1987 [IL] Israel .................................... 84255

[51] Int. Cl.$^5$ .................................. C08C 19/08
[52] U.S. Cl. ........................... 430/329; 430/945; 430/644; 427/331; 427/444; 156/643
[58] Field of Search .............. 430/329, 945, 644, 326; 427/444, 331; 350/6.1, 6.2; 156/643

[56] References Cited

U.S. PATENT DOCUMENTS

| | | | |
|---|---|---|---|
| 3,890,176 | 6/1975 | Bolon | 430/329 |
| 4,414,059 | 11/1983 | Blum et al. | 430/313 |
| 4,508,749 | 4/1985 | Brannon et al. | 156/643 |
| 4,615,765 | 10/1986 | Levinson et al. | 156/643 |
| 4,643,799 | 2/1987 | Tsuji et al. | 156/643 |
| 4,671,848 | 6/1987 | Miller et al. | 156/643 |
| 4,705,593 | 11/1987 | Haigh et al. | 156/643 |
| 4,718,974 | 1/1988 | Minsee | 156/643 |
| 4,731,158 | 3/1988 | Brannon | 156/643 |
| 4,786,358 | 11/1988 | Yamazaki et al. | 156/643 |
| 4,877,644 | 10/1989 | Wu et al. | 430/945 |
| 4,946,763 | 8/1990 | Snakenborg | 430/945 |
| 5,007,983 | 4/1991 | Lerner et al. | 156/643 |

FOREIGN PATENT DOCUMENTS 58-31528 2/1983 Japan.

OTHER PUBLICATIONS

Kirk-Othmer; Encyclopedia of Chemical Technology; Third Edition vol. 13; Hydrogen-Ion Activity to Laminated Materials, Glass.

Primary Examiner—Marion E. McCamish
Assistant Examiner—Christopher D. Rodee
Attorney, Agent, or Firm—Fleit, Jacobson, Cohn, Price, Holman & Stern

[57] ABSTRACT

A process and a system for the complete stripping of the photoresist layer from semiconductor wafers after each processing step (lithography step) in a multi-step production process. At the end of each such step the photoresist must be removed, preparing the wafer for the next step, and such removal is also required after the final processing step. Up to 15 or more steps are needed in such wafer production process. According to the invention a high intensity pulsed laser beam sweeps the wafer surface as a narrow, preferably rectangular and strip the photoresist by sweeping the entire surface of the wafer. Pulse duration is generally shorter than 500 nano-sec (nsec) and preferably about 10 to 100 nsec, with much larger time intervals between pulses. The interaction of the beam with the photoresist ablates the photoresist. The ablation proceeds stepwise, each pulse ablating a certain area of the photoresist to a certian depth, and this without any damage to the processed wafer. The sweep suffices to completely remove the photoresist, reading the wafer for the next process step; the overall duration of the removal being short.

7 Claims, 2 Drawing Sheets

MAIN REQUIREMENT FOR STRIPPING BY LIGHT PULSE

MAIN REQUIREMENT FOR STRIPPING BY LIGHT PULSE

PHOTORESIST REMOVAL

This is a continuation-in-part of application Ser. No. 07/260,526 filed Oct. 21, 1988 now abandoned.

FIELD OF INVENTION

There is provided a process for complete photoresist removal after each process step of a multi-step production process of semiconductor wafers and hybrid substrates, without damaging the wafer. There is also provided a system for effecting such process. Such complete stripping of the photoresist is necessary to prepare the wafer for the next process step. The entire surface of the wafer is swept by a high intensity pulsed beam in the 150 nm to 2,000 nm range, of brief pulse duration (generally less than 500 nsec, preferably less than 100 nsec), which beam contacts the wafer surface as a narrow rectangle which is swept over the entire wafer surface. Photoresist layers are typically about 0.8 to 4 um thick, and each such pulse in the pulse train results in an ablation of photoresist layer to a certain depth, the sequence of many such pulses completely removing the entire photoresist. Typically each pulse removes a 200 Å to 2500 Å layer of the photoresist. Photoresist has to be removed after each such process step of a production process of up to 15 process steps, or even more.

BACKGROUND OF THE INVENTION

The invention relates to the production of semiconductor devices and of hybrid circuits. Semiconductor devices have attained in recent years a very important role in electronics and especially in computer technology. The value of such products is of the order of billions of US-$ per year. One of the repeat step during semiconductor wafer and hybrid processing is the application of a photoresist coating, which has to be removed at the end of each process step sequence. Such wafers are of the order of size of about 2.5 cm to about 20 cm diameter or more. The essentially complete stripping of the photoresist at the end of each production step constitutes a serious problem and is presently effected mainly by one of two alternate processes: one is a wet chemical process, the other is based on the use of plasma. The drawback of existing processes is that they do not warrant a complete removal of the photoresist layer unless quite extreme conditions are resorted to; application of too drastic process conditions may cause damage to the wafer-substrate and/or to the components on the wafer.

During the production process of such wafers, there is applied at each processing step a photoresist coatings. In all from 1 to 15 or even more such steps are required, each of which comprises a number of operations, from application of liquid photoresist to its stripping. The present invention is intended to overcome the drawbacks of the existing removal processes based on chemical solutions or on the use of plasma stripping where residual photoresist contamination frequently remains on some parts of the area of the wafer, and where damage occurs sometimes during plasma use, both of which, result in a certain rate of rejection and which increase production costs per device.

In the production process of semiconductors it is necessary to distinguish between the illumination and development steps which are needed for copying the mask pattern to the applied photoresist layer on the wafer and the step of complete photoresist removal—photoresist stripping—which is required at the end of each process step sequence.

Following is a short description of the common steps: After applying a layer of photoresist to the wafer the photoresist is dried by relatively low temperature which is called Soft Bake, Illumination through mask and developing are following to create (or copy) the mask pattern on the photoresist layer and only selective portions of the photoresist are removed. It is possible to use different light sources for this step like incandescent lamps, UV light sources or lasers, it is also possible to direct writing the pattern by moving one of the mentioned light sources according to the needed pattern. In this step (of creating or copying the mask pattern) the energy of the light source is low as the photoresist is soft baked after low temperature drying and still light sensitive. The process which is described in U.S. Pat. No. 4414059 by S. E. Blum is related to the photoresist removal during a given step and not to the stripping at the end of such process step which requires different process parameters.

Following the pattern creation step the photoresist passes an extra drying process called "Post Bake" or "Hard Bake" which is done at a higher temperature. After this step the photoresist is more stable and ready for the next steps like etching or ion implantation which further hardens the photoresist. At the end of each of such sequence of operations, it is necessary to completely remove the photoresist for the next process step. The present invention relates to the complete stripping of Hard Baked photoresist at the end of each process cycle and at the end of the last processing step.

The process of the invention is one of ablative stepwise removal (stripping) of the photoresist by a sweep of a beam of high energy pulses in the UV wave length range, each of which pulses removes a certain depth of the photoresist layer.

SUMMARY OF THE INVENTION

The process of the invention relates to stripping the entire photoresist layer from a semi-conductor wafer between processing steps, at the end of each such step, and at the end of the entire multi-step processing process.

The process is applicable to practically all photoresist types, positive and negative ones, and to any similar photosensitive layers.

The removal is effected by sweeping the surface from which the photoresist is to be completely removed with a narrow pulsed beam of high-intensity, with short duration pulses. A pulsed energy beam is required for the ablation of the photoresist, and generally pulses of less than about 500 nsec preferably shorter than 100 nsec are used. There may be used lasers as energy source, and although radiation in the 150-2,000 nm range (pulsed) maybe used, best results were obtained by using Excimer lasers in the 193 nm to 351 nm wave length range. Other shorter wave lengths which may be available can be used, a range of 150 nm to about 400 nm being preferred. The process of the invention is used with semiconductor wafers, after each process step when the photoresist layer is hardened and more difficult to remove. Each process step comprises a plurality of operations, such as application of a liquid photoresist layer to a wafer, drying (soft-bake), illuminate developing exposed areas, "post-bake", processing by etching, ion implantation, plasma etch or the like. At the end of such a sequence it is necessary to completely strip from the wafer the hardened photoresist layer in order to prepare it for the next process step. This is done as many times as required, and also after the last processing step the photoresist has to be removed.

Photoresist layers are generally about 0.8 um to about 4 um thick. The hardened layer which has to be removed at the end of each processing step is much more resistant than the photoresist at the stage of pattern formation.

The ablative removal is by means of short, high-energy pulses which result in a break-up of bonds, partial vaporization, scattering of fine particles from the surface etc. The depth of penetration of the beam is small and only a very small depth of the layer is affected. Measurements have shown that with, for example, 20 nsec pulses of about 500 mJ, in the form of a sweeping beam having a contact area of about 0.5 mm by the width of the wafer, there resulted a controlled ablation of the photoresist to a depth of about 200 Å to about 2500 Å per pulse. As the wafer is swept by the beam, it is exposed to a plurality of pulses. There takes place a stepwise ablation, the pulse frequency being in the 10 Hz to 1000 Hz range. The frequency used is not critical, it depends on the pulse energy and duration. It is stressed that no harm is to be caused to the wafer structure. Best results were obtained with excimer lasers, such as those having a radiation of 193 nm, 248 nm or 308 nm.

The energy of the beam is strongly absorbed by the photoresist, and this explains to a large extent the ablative stepwise removal of the photoresist.

The thickness of the photoresist coating is generally of the order of from about 0.8 to 4 microns, preferably in the 1–2 micron range. The required energy depends on the thickness of the photoresist, its nature, the wavelength of the pulsed energy beam, and its absorption by the photoresist.

The required energy can be of the order of 10 mJ to about 1000 mJ per $cm^2$, and is generally between 50 mJ and 300 mJ per $cm^2$, in the 150 nm to 2,000 nm wave length range.

With other energy means, an equivalent energy per unit area has to be applied, one of the considerations being the absorption of the energy by the photoresist.

The process of the invention is effected in a dry environment. The wafer is located in the free atmosphere or in a suitable container, in which the atmosphere can be controlled. When an inert atmosphere is desired, there can be used an environment of an inert gas or gas-mixture. Suitable gases are helium, argon, nitrogen or the like, or mixtures of any of these.

The process can also be effected in a reactive atmosphere, such as that of oxygen, ozone, oxygen compounds, carbon tetrachloride vapor, nitrogen-trifluoride, etc. This reactive atmosphere is applied before and/or during or after irradiation. The energy beam is swept over the surface of the wafer, or the wafer can be moved respective the beam, so as to expose the surface of the wafer to an adequate energy per unit area for photoresist stripping.

For example, when a laser of the Excimer type is used, of a pulse duration of about 10 nanosecond, at a pulse frequency of 100 Hz, a wafer of $3'' \times 3''$ is scanned by a light beam of 193 nm contacting the wafer at a width of 0.5 mm at a linear sweep-rate of about 7 mm/sec, so that each square centimeter of the wafer surface is swept by, and exposed to an energy of between 100 $mJ/cm^2$ and about 300 $mJ/cm^2$. Each pulse results in the ablation of a layer about 200 Å to 2500 Å depth.

The invention further relates to devices for photoresist removal by exposure of the surface of the wafer to a high-intensity beam. The beam is concentrated by suitable means to a narrow rectangle or other geometrical shape, the length of which corresponds to the length or width of the wafer which is being swept by the energy beam.

With light beams, conventional optical elements can be used to concentrate the beam to a narrow rectangle. As stated, there is used a pulsed beam of 10 to 1000 Hz. The width of the beam will be generally of the order of from 0.2 mm to about 5 mm, the preferred range being from 0.3 mm to about 0.6 mm, the length of the beam being of the order of 10 to 200 mm and more, as required, direction of sweep being perpendicular to the long dimension of the beam. The entire wafer area is swept within from about 5 to 100 seconds, or more, resulting in essentially full photoresist stripping.

Figure 2:
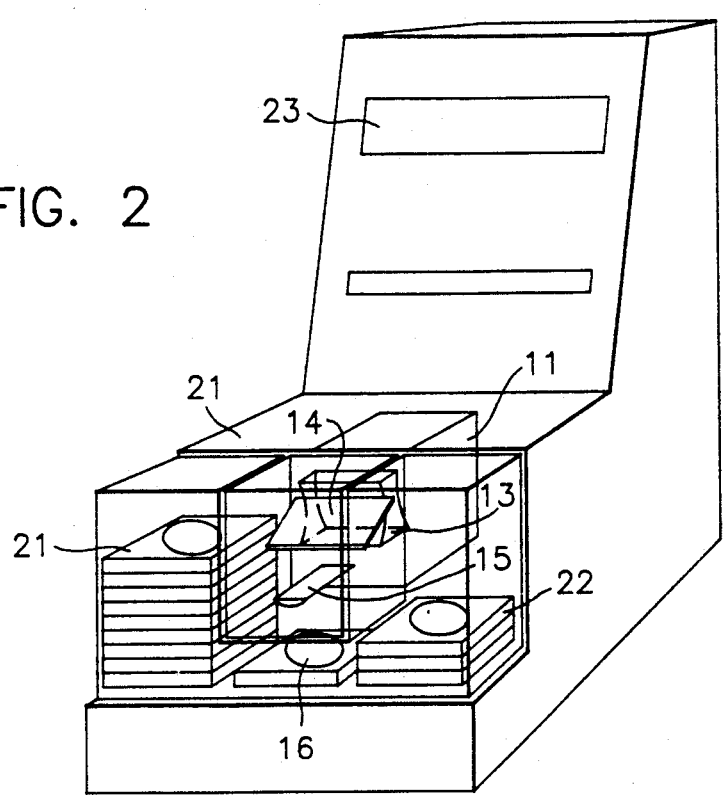
Figure 3:
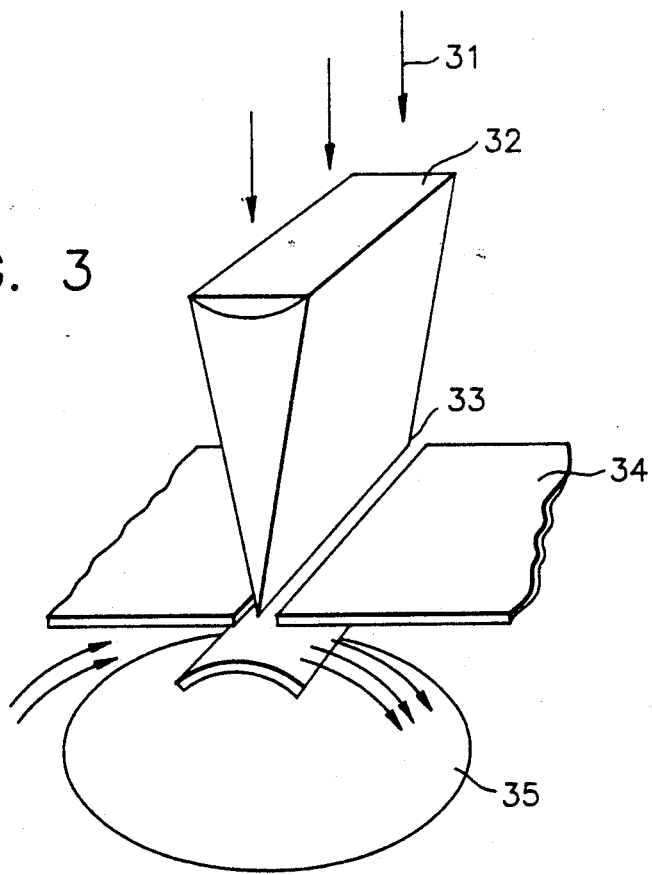

The invention is illustrated with reference to the enclosed drawings, which are of a schematical nature, not according to scale, and in which:

FIG. 1—is an illustration of the basic concept of a device for carrying out the process of the invention;

FIG. 2—illustrates a device for carrying out such process;

FIG. 3—illustrates photoresist stripping in a reactive environment.

Figure 4:
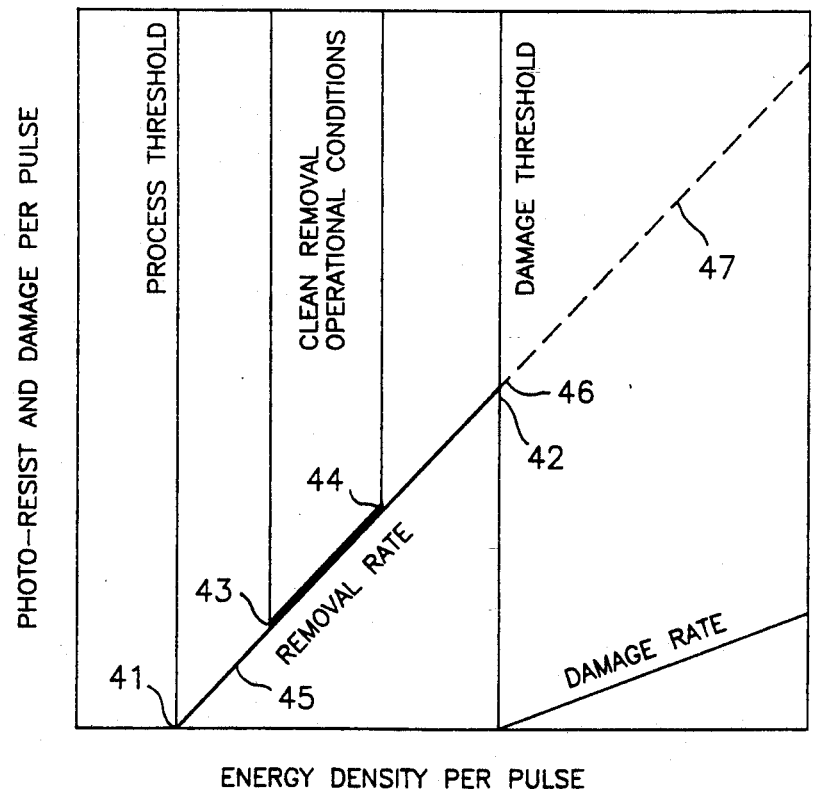

FIG. 4—is a diagram illustrating the critical parameters of the process of the invention.

The principle of the device is illustrated with reference to FIG. 1 where a light-source 11 directs a beam of light 12 which is concentrated by optical lens 13 and mirror 14 and lens 15 to an elongated narrow beam at 16, i.e. the surface of the water 17. Part of the wafer 17 is shown with photoresist (18), while the other part 19, has already been swept by the beam 16, and the photoresist removed. The beam can be swept over the surface of the wafer, or the wafer can be moved as indicated by arrow 20, respective to the stationary light beam. The two motions can be combined.

A device is illustrated in FIG. 2, where the device comprises a housing 21, wherein there is provided a light-source 11, directing a light beam via optical element 13 and mirror 14 and lens 15, onto the surface of a wafer 17. Other wafers are stored before photoresist removal in cassette 21, while wafers after photoresist removal are stacked at the right in stack 22. The unit comprises mean 23 for adjusting the process parameters.

The process of the invention can be effected in a reactive environment. The principle of such process is illustrated with reference to FIG. 3, where light coming from a source is illustrated by arrow 31, and where optical element 32 is used to focus the light to an elongated rectangular beam 33, after passing through shutter 34, said beam being directed at wafer 35.

The process is effected in a reactive environment, where the light beam is used to dissociate reactive species in gaseous (vapor) form, which resulting reactive species interact with the photoresist, the ablated products of decomposition being removed from the chamber. The wafer can be moved respective the beam or vice-versa.

The process can also be effected in such a manner that reactive species are supplied to the reaction chamber before and/or during and/or after irradiation, aiding the complete stripping of the photoresist.

The critical parameters of the process are illustrated with reference to FIG. 4, which is diagram showing energy density versus effect on the wafer/wafer components. As shown, there exist well defined areas, passing from left to right; photoresist removal starts at energy threshold 41, the energy density up to 42 being without adverse effects on the wafer. The optimum range of energy density per unit area for clean photoresist removal is between 43 and 44, the slope of line 45 being indicative of the removal rate of the photoresist.

At an energy, density exceeding that indicated by 46, damage to the wafer substrate and/or electronic components starts, and as the energy per unit area further increases the damage rate indicated by line 47 increases. The energy indicated on the X-axis can be that per light-beam pulse, it can also indicate the energy applied per unit area of the wafer as this is exposed to the energy-beam.

EXAMPLE 1

To a silicon wafer of 50 mm diameter, there was applied a photoresist layer of 1.8 micrometer thickness. After each processing step, this had to be stripped. This was effected by means of a light beam of 193 nm wave length from a pulsed Excimer laser at a pulse rate of 100 pulses per second, individual pulse duration being about 10 nanosecond.

The light beam was concentrated to a rectangle of 75 mm by 0.5 mm, and the wafer was swept by this beam at a rate of 4 mm/second.

Thus, each square centimeter of the area of the wafer was exposed to an energy of about 200 mJ/cm$^2$, which resulted in the complete ablation of the photoresist without adverse effects on the wafer or the electronic elements on the wafer.

EXAMPLE 2

A photoresist removal was effected in a reactive environment. The process chamber was charged with the reactive species such as an oxygen or fluorine compound. The reactive species was formed either by an excimer laser or by an outside reactor. The joint reaction of the reactive species and the laser beam facilitating the removal of photoresis. A laser beam at a wave length of 193 and/or 248 n with flux of 50 to 500 mJ/cm$^2$ was used and resulted in complete photoresist removal. Suitable compounds are of the oxygen or oxygen compound, such as N$_2$O type. The frequency was 100 pulses/second.

I claim:

1. A process for removal of a patterned, post-baked photoresist layer from a semiconductor wafer performed in a dry atmosphere, comprising the steps of scanning a surface of the wafer by means of a narrow rectangular pulsed high energy beam so that each point of the wafer surface is exposed to a train of pulses, wherein each pulse has a duration of less that 100 nsec (nanoseconds), an energy from 50 mJ/cm$^2$ to 300 mJ/cm$^2$ and a wavelength between 150 nm and 400 nm, and wherein further each pulse of the beam ablates the post-baked photoresist layer to a certain depth, so that the train of pulses completely removes by ablation the entire post-bake photoresist layer without damaging the wafer.

2. A process according to claim 1, where the source of the beam is an Excimer laser and the wavelength is in the 193 nm and 351 nm range.

3. The process of claim 1, wherein each area of the photoresist is scanned a number of times until the entire photoresist layer is ablated.

4. The process of claim 1, wherein the laser is an Excimer laser having a wavelength of 193 nm, 248 nm, 308 nm or 351 nm, the duration of each pulse being between 10 nsec and 50 nsec.

5. The process of claim 4, wherein the frequency of the pulses is from 10 Hz to 1,000 Hz.

6. The process of claim 1, wherein the ablation is effected while the wafer is in an reactive atmosphere.

7. A process for the complete stripping of a patterned, post-baked photoresist layer from a semiconductor wafer in a dry atmosphere, comprising the steps of sweeping an area of the wafer by means of an elongated narrow beam at its intersection with the wafer, wherein the beam is a high intensity beam of a laser, and wherein further the beam is pulsed at pulses of about less that 200 nsec duration, at a wavelength of from about 150 nm to about 400 nm, and applies per cm$^2$ of the wafer an energy of from about 50 mJ to about 300 mJ, so that the pulsed beam completely strips by ablation the entire post-baked photoresist layer without damaging the wafer.

* * * * *